United States Patent
Ali

(10) Patent No.: US 8,018,254 B2
(45) Date of Patent: Sep. 13, 2011

(54) REDUCING DEVICE PARASITICS IN SWITCHED CIRCUITS

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 84 days.

(21) Appl. No.: 12/471,688

(22) Filed: May 26, 2009

(65) Prior Publication Data

US 2010/0301930 A1    Dec. 2, 2010

(51) Int. Cl.
*G11C 27/02* (2006.01)
*H03K 5/00* (2006.01)
*H03K 17/00* (2006.01)

(52) U.S. Cl. ......................................................... 327/94
(58) Field of Classification Search .................... 327/91, 327/93–97, 534
See application file for complete search history.

(56) References Cited

U.S. PATENT DOCUMENTS

| | | | | |
|---|---|---|---|---|
| 6,094,088 A * | 7/2000 | Yano | .............................. | 327/534 |
| 6,238,987 B1 | 5/2001 | Lee | | |
| 6,281,737 B1 * | 8/2001 | Kuang et al. | .................. | 327/382 |
| 6,348,831 B1 * | 2/2002 | Baba | .............................. | 327/537 |
| 6,538,491 B1 * | 3/2003 | Spanoche | ...................... | 327/337 |
| 7,088,147 B2 * | 8/2006 | Prasad et al. | ..................... | 327/91 |
| 7,157,956 B2 * | 1/2007 | Wei | ............................... | 327/337 |
| 7,256,438 B2 | 8/2007 | Shor et al. | | |

OTHER PUBLICATIONS

Ali et al., "A 14-bit 125 MS/s IF/RF Sampling Pipelined ADC with 100 dB SFDR and 50 fs Jitter", IEEE Journal, vol. 41, Issue 8; pp. 1846-1855; Aug. 2006.

* cited by examiner

*Primary Examiner* — Quan Tra
(74) *Attorney, Agent, or Firm* — Kenyon & Kenyon LLP

(57) ABSTRACT

A system and method are provided to reduce the influence of parasitic capacitance at the drain and source of MOS transistors of a sampling circuit. In one embodiment, the bulk is left floating during a first phase and refreshed during a second phase. During the first phase, the effective parasitic contribution of the drain or source of a MOS transistor is lower due to the series combination of Cj and Cw capacitances. In another embodiment, a large resistance provides a path from a reference voltage to the bulk of a MOS transistor, thereby resulting in an effective parasitic capacitance of the series combination of Cj and Cw. Advantageously, the parasitic capacitance is reduced as well as its non-linear effect, the operating speed is improved, as well as the signal distortion and noise.

14 Claims, 3 Drawing Sheets

REDUCING DEVICE PARASITICS IN SWITCHED CIRCUITS

COPYRIGHT AND LEGAL NOTICES

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates generally to switched capacitor circuits and more particularly to circuits and methods for reducing MOS parasitics in such circuits.

BACKGROUND INFORMATION

Metal Oxide Semiconductor (MOS) transistors are used in a wide variety of ways in switched capacitor circuits. For example, they can be used as switches, current sources, amplifiers, etc. These MOS transistors have inherent parasitic components, which may lead to limitations to circuit speed, signal distortion, and noise. The drain (or source) to bulk parasitics are of special concern because of the large parasitic capacitance component and its non-linearity. The parasitic capacitance is related to the P-N junctions formed between the drain to bulk and drain to source respectively. The capacitance of a P-N junction is non-linear in that it is voltage dependent and may, therefore, contribute to signal distortion and noise.

It is a goal of an embodiment of the present invention to provide a circuit and method to reduce the influence of the parasitic capacitance at the drain and source of a MOS transistor and its non-linearity, thereby increasing its operating speed, reduce signal distortion, and reduce noise.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF EXAMPLE EMBODIMENTS

A system and method are provided to lower the effective parasitic capacitance contribution of MOS transistors on coupled circuitry in a sampling circuit. Advantageously, the maximum operating speed is improved as well as signal distortion and noise.

Figure 1:
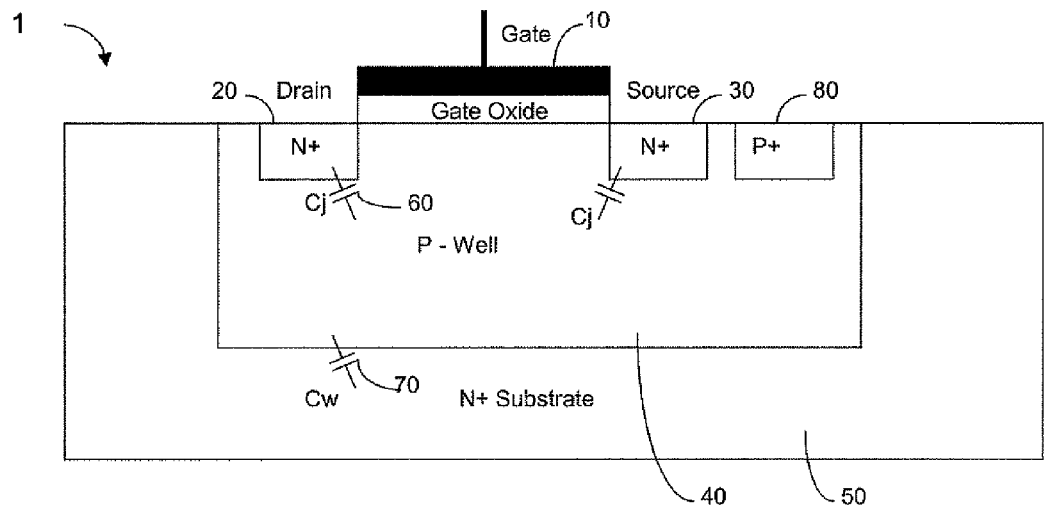
FIG. 1 illustrates a cross section of a typical MOS transistor.

FIG. 1 illustrates a cross section of a MOS transistor. A MOS transistor may comprise a plurality of wells, each being n-type or p-type. In the exemplary embodiment of FIG. 1, MOS 1 is n-type and includes a gate 10, a drain 20 which is n-type, a source 30 which is n-type, a first layer 40 which is p-type, a contact 80 to the first layer, a second layer 50 which is n-type, and a third layer 90 which is p-type. Every P-N junction, (i.e., junction 20 to 40, 30 to 40, 40 to 50, or 50 to 90), may be reverse biased during normal operation to prevent signal leakage. Each P-N junction exhibits a voltage-dependent parasitic capacitance associated with its depletion region. The higher the reverse bias of a junction, the wider the depletion region, and the lower the junction capacitance Cj or Cw. Equation 1 below provides an estimate of a junction capacitance Cj using the junction between the drain 20 to first layer 40 as an example.

$$Cj = \frac{Cjo}{(\sqrt{1 + \frac{Vj}{\psi_0}}} \quad \text{(Eq. 1)}$$

Where Cjo is the capacitance of the junction at no bias,
Vj is the reverse bias of the junction, and
$\psi_0$ is the built in work function of the junction.

In one embodiment, the contact 80 to the first layer 40 may be connected to a predefined voltage. For example, for a PFET, contact 80 may be connected to Vdd. For an NFET, contact 80 may be connected to ground. Thus, the first layer 40 may be connected to a predefined voltage. In such a configuration, the MOS transistor 1 contributes an effective parasitic capacitance of Cj (60) to any circuitry connected to either the drain (20) or source (30). The first layer 40 may be left floating by applying no voltage to contact 80. For an NFET, second layer 50 may be connected to Vdd or higher. In such a configuration, the MOS transistor 1 contributes an effective parasitic capacitance equivalent to the series capacitance of Cj (60) and Cw (70). These parasitic capacitance contributions are from the junctions between drain 20 (or source 30) and first layer 40, and first layer 40 and second layer 50. Equation 2 below describes the equivalent capacitance of Cj (60) and Cw (80) when effectively in series.

$$Ct = \frac{1}{\frac{1}{Cj} + \frac{1}{Cw}} \quad \text{(Eq. 2)}$$

Thus, the total capacitance Ct is substantially less when first layer 40 is floating than when first layer 40 is connected to a predefined voltage. In one embodiment, during a first phase, the first layer may be connected to a predefined voltage, the effective parasitic capacitance being CJ (60). In a second phase, the first layer may be left floating, the effective parasitic capacitance being the series combination of Cj (60) and Cw (70). Thus, in the first phase, Ct=Cj, whereas in the second phase, Ct<<Cj.

Figure 2:
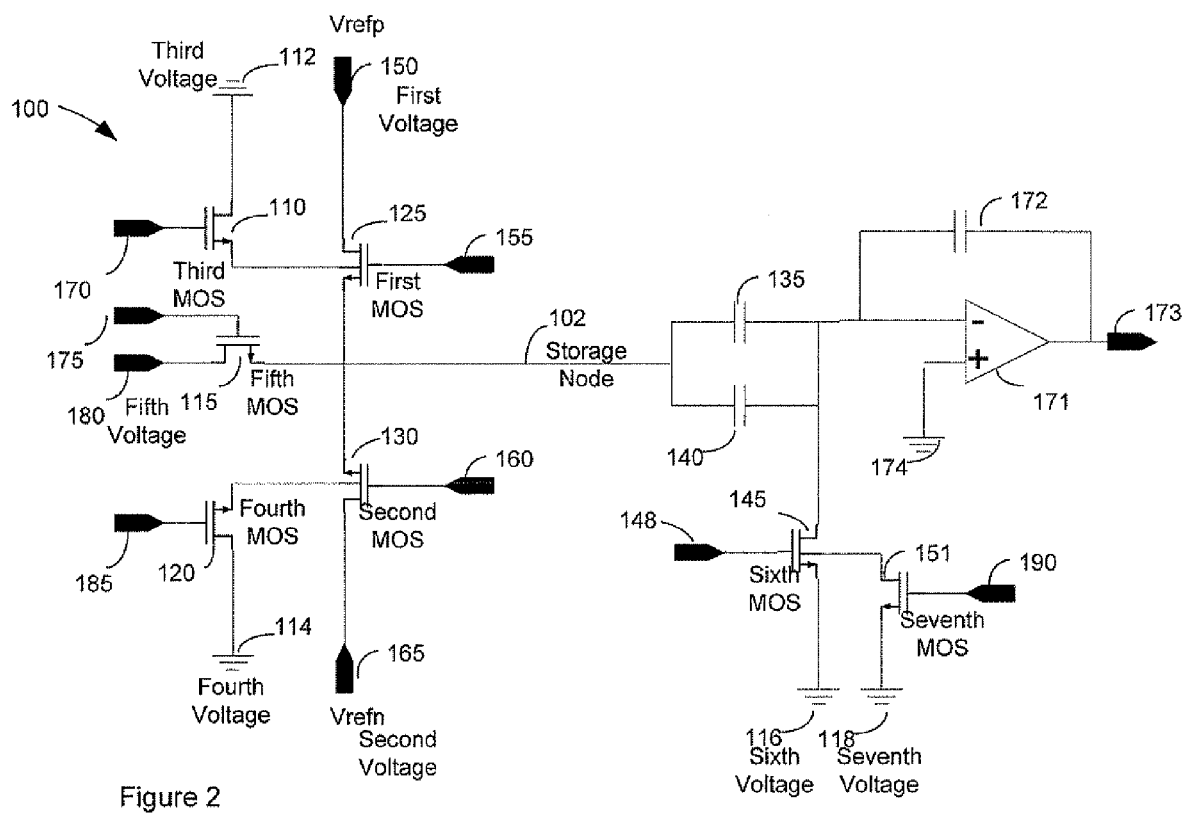
FIG. 2 shows a sampling circuit in accordance with an embodiment of the present invention.

FIG. 2 shows a sampling circuit in accordance with an embodiment of the present invention. Sampling circuit 100 includes storage node 102, coupled to a first end of least one memory element. In one embodiment, the memory element comprises a capacitor 135 or 140. A plurality of memory elements may be used. Further, a plurality of MOS transistors may be coupled to storage node 102. For example, a first MOS 125 may provide a path from a first voltage 150 to storage node 102 when the first MOS 125 is turned "ON" (or at a "high" voltage) through gate signal 155. A second MOS 130 may provide a path from a second voltage 165 to storage node 102 when the second MOS 130 is "ON" when gate signal 160 is "high." In one embodiment, voltage 150 is Vrefp and voltage 165 is Vrefn. Both Vrefp and Vrefn may be of the same magnitude but of opposite polarity. Further, Vrefp (and Vrefn) may be the reference voltage for the ADC. In one embodiment the Vrefp (and Vrefn) may be derived from a bandgap reference circuit.

A third MOS 110 may be configured to provide a path from a third voltage 112 to the bulk of first MOS 125, (first layer 40 of FIG. 1). In one embodiment, third voltage 112 may be ground. When signal 170 at the gate of the third MOS 110 is "high," the transistor is turned "ON" allowing a path from the third voltage 112 to the bulk of the first MOS 125. Similarly, a fourth MOS 120 may be configured to provide a path from a fourth voltage 114 to the bulk of the second MOS 130. In one embodiment, the fourth voltage 114 may be ground. When signal 185 at the gate of the fourth MOS 120 is "high," the transistor is turned "ON" allowing a path from the fourth voltage to the bulk of the second MOS 130. When the signal 170 at the gate of the third MOS 110 is "low," third MOS 110 is turned "OFF," thereby floating the bulk of the first MOS 125. Similarly, when the signal 185 at the gate of the fourth MOS 120 is "low," fourth MOS 120, is turned "OFF," thereby floating the bulk of the second MOS 130.

As provided in the discussion of FIG. 1 above, when the bulk of a transistor is floating, for example first MOS 125 or second MOS 130, the effective parasitic capacitance at the drain or source of the respective transistor alters from Cj to the series combination of Cj and Cw. The series combination of Cj and Cw may be substantially less than Cj as described in equation 2.

As further regards the embodiment of a sampling circuit 100, a fifth MOS 115 may be configured to provide a path from a fifth voltage 180 to storage node 102 when the fifth MOS transistor 115 is turned "ON" through gate signal 175. In one embodiment input 180 provides the sampling input signal. Further, a sixth MOS transistor 145 may be configured to provide a path from a sixth voltage 116 to the second end of the at least one memory element (i.e., capacitors 135 or 140). When signal 148 at the gate of the sixth MOS transistor 6 is "high," the transistor is turned "ON" allowing a path from the sixth voltage 116 to the bulk of the sixth MOS transistor 145. In one embodiment sixth voltage 116 is ground. A seventh MOS transistor 151 may be configured to provide a path from a seventh voltage 118 to the bulk of the sixth MOS transistor 145. In one embodiment, the seventh voltage may be ground or lower. When input 190 at the gate of the seventh MOS transistor 151 is "high," the transistor is turned "ON" allowing a path from the seventh voltage to the bulk of the sixth MOS transistor 130. When the signal 190 at the gate of the seventh MOS transistor 151 is "low," seventh MOS transistor 190 is turned "OFF," thereby floating the bulk of the sixth MOS transistor 125.

Advantageously, the sampling circuit 100 is flexible enough to accommodate different sampling functions. For example, it can be integrated in an MDAC or used as a dedicated sample and hold circuit. When integrated in an MDAC, voltage 150 is Vrefp and voltage 165 is Vrefn. Further, each memory element (i.e., capacitance 135 or 140) is connected to Vrefp or Vrefn based on the output of the flash through its dedicated switch (i.e., MOS transistor 125 or 130 accordingly). For example, in a 3-bit MDAC, there may be eight capacitors ($2^3$=8) with 8 switches, each leading to Vrefp or Vrefn.

When used as a dedicated sample and hold circuit, the at least one memory element is coupled to a common mode voltage (Vcm) or a reference voltage through one switch (i.e., either MOS transistor 125 or MOS transistor 130). Unlike the MDAC, a single MOS transistor 125 or MOS transistor 130 may be sufficient for a plurality of memory elements. Irrespective of whether integrated in an MDAC or used as a dedicated sample and hold circuit, a single MOS transistor 145 may be enough to provide a path from a sixth voltage 116 to the second end of the at least one memory element (i.e., capacitors 135 or 140).

Figure 3:
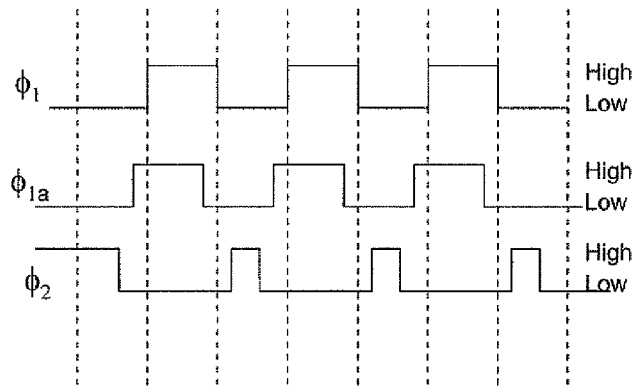
FIG. 3 provides a timing diagram in accordance with an embodiment of the present invention.

FIG. 3 provides a timing diagram in accordance with an embodiment of the present invention. To facilitate the discussion of this exemplary embodiment, it can be assumed that $\phi_1$ represents the gate input 175 that passes the input signal 180 to the storage node 102; $\phi_{1a}$ represents the signal at inputs 148 and 190; and $\phi_2$ represents the signal at inputs 155, 160, 170, and 185. In one embodiment, the signals $\phi_1$ and $\phi_2$ may be opposite in phase but non-overlapping. As illustrated in FIG. 3, signal $\phi_{1a}$ may be substantially similar to $\phi_1$ except that it may lead in time. In one embodiment, the shape of signal $\phi_2$ is governed by FLASH controller decisions. For example, it may decide whether to turn "ON" MOS transistor 125 to allow a path from first voltage to storage node 102. Further, the FLASH controller may determine whether to turn "ON" transistor 130, allowing a path from the second voltage to storage node 102. It is noted that in this embodiment, MOS transistors 125 and 130 are not turned on simultaneously. For the remainder of the discussion of this exemplary embodiment, it can be assumed that the FLASH controller is holding MOS transistor 130 in the "OFF" configuration. It will be understood that the principles discussed in the context of MOS transistor 125, apply to MOS transistor 130 as well.

As further regards this exemplary embodiment, during the first phase, (i.e., sampling phase), $\phi_{1a}$ is high, turning "ON" MOS transistor 145, allowing a path from the sixth voltage (ground in this example) to the second end of capacitors 135 and 140, thereby enabling charge to be stored at node 102. Further, during this sampling phase, the bulk of the sixth MOS transistor 145 is connected to the seventh voltage (i.e., ground). Accordingly, the drain of MOS transistor 145 contributes a parasitic capacitance of Cj to the second end of capacitors 135 and 140. This higher parasitic capacitance of Cj is acceptable because, for MOS 145, it is more important to have a lower parasitic contribution during the second phase (i.e., hold phase). Further, during the sample phase, MOS transistor 125 is "OFF," preventing a path from first voltage (i.e., Vrefp) to storage node 102. The bulk of MOS transistor 125 is floating because MOS transistor 110, which provides a path from the third voltage (i.e. ground) to the bulk of MOS transistor 125, is "OFF" during the sample phase. As a result, the parasitic components Cj and Cw of MOS transistor 125 are effectively connected in series. Thus, the emitter of MOS transistor 125 contributes a parasitic capacitance of only 1/(1/Cj+1/Cw) to storage node 102. Accordingly, during the sampling phase, the effective parasitic capacitance at the storage node 102 is lower, thereby improving the speed of the circuit. Further, since the parasitic capacitance is voltage dependent and, hence, non-linear, the reduction of the effective parasitic capacitance in turn reduces distortion which may improve noise and signal quality.

In one embodiment, during the second phase, (i.e., hold phase), while the memory element is not active, the bulk of MOS transistor 125 may be refreshed periodically with $\phi_2$ being high, providing the bulk of MOS transistor 125 a path to a third voltage (i.e., ground). This may prevent the voltage of the bulk from drifting. It is noted that in a P-N junction, the capacitance has an inverse relation to its reverse bias. In this regard, the third voltage is not limited to ground and may be the lowest voltage on the chip, or even a dedicated voltage on the chip, to further reduce the parasitic components of Cj and Cw. During refresh, the emitter of MOS transistor 125 contributes an effective parasitic capacitance of Cj which is higher than its series combination with Cw. However, during refresh, the parasitic capacitance does not have a substantial effect on the sampling circuit 100. Instead, in one embodiment, the storage elements (i.e., capacitors 135 and 140) may provide the stored charge of the storage elements to the output 173 of the amplifier 171.

Figure 4:
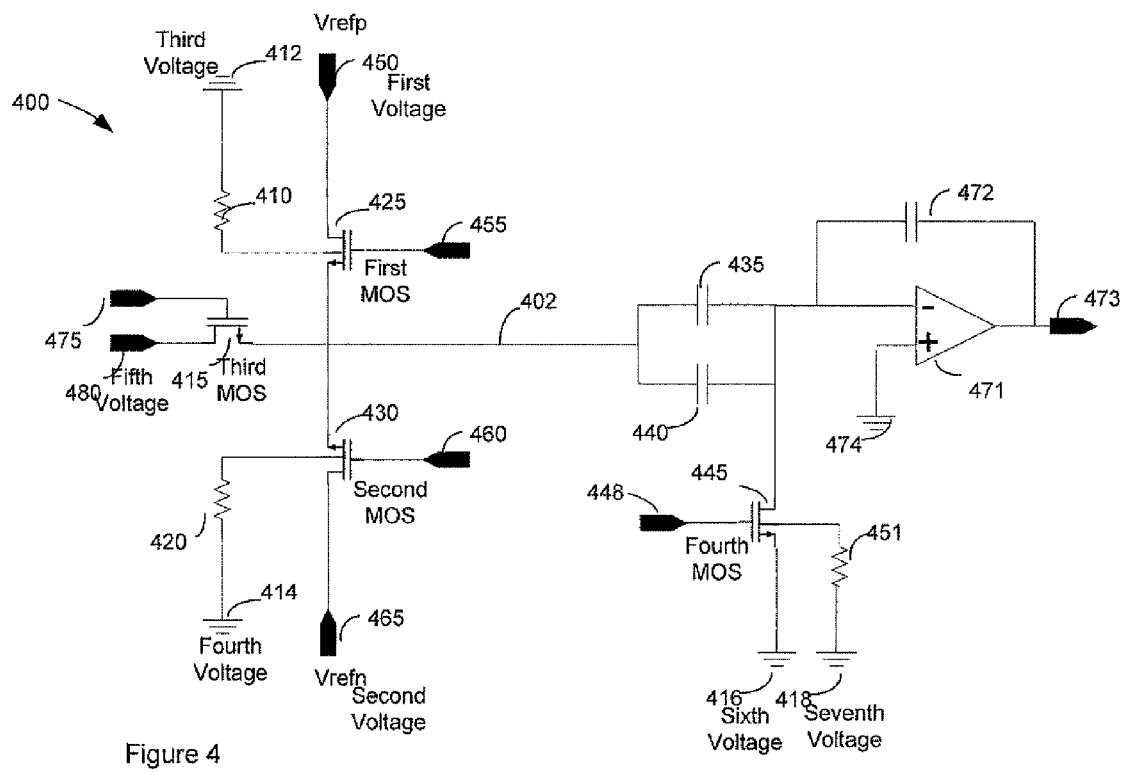
FIG. 4 shows a sampling circuit in accordance with an embodiment of the present invention having a large resistor between a reference voltage and the bulk of a MOS.

In another embodiment of the present invention, the path from a reference voltage to the bulk of a MOS transistor is provided through a resistance. FIG. 4 shows a sampling circuit in accordance with an embodiment of the present invention where transistors 110, 120, and 151 of FIG. 2 are replaced by large resistances 410, 420, and 451 accordingly. In one embodiment, these large resistances may be in the range of hundreds of KΩ or MΩ. Resistances 410, 420, and 451 may be resistors or MOS transistors operated in the linear region, providing large resistances. Using first MOS transistor 425 as an example, the bulk of MOS transistor 425 is connected to a third voltage 412 (ground in this example) through large resistance 410. Since resistance 410 is sufficiently large, the bulk of transistor 425 is floating for parasitic capacitance purposes. Accordingly, the effective parasitic capacitance contributed by MOS transistor 425 to storage node 402 is its series combination of Cj and Cw, which may be substantially smaller than Cj. Advantageously, this configuration may not require refresh of the bulk of MOS 410 because, even though there is a large resistance between a third voltage and the bulk, this path is enough to prevent the bulk of MOS 410 from drifting. The same principles as provided in the context of the discussion of MOS transistor 425, also apply to MOS transistors 430 and 445.

In yet another embodiment of the present invention, the resistance in the path from a reference voltage to the bulk of a MOS transistor may be removed completely for MOS transistors that may not be of substantial concern of contributing parasitic capacitance. For example, resistances 410 and 420 of FIG. 4 may be very low or removed altogether. Accordingly, in such a configuration, the effective parasitic capacitance contributed by MOS transistors 425 and 430 to storage node 402 is Cj respectively. A large resistance 451 or a fifth MOS transistor (not shown) may be configured to provide a path from a fifth voltage 418 (ground in this example) to the bulk of the fourth MOS transistor 445 when fifth MOS transistor is "ON." Accordingly, the parasitic contribution of MOS transistor 445 is the series combination of Cj and Cw for at least the hold phase.

Figure 5:
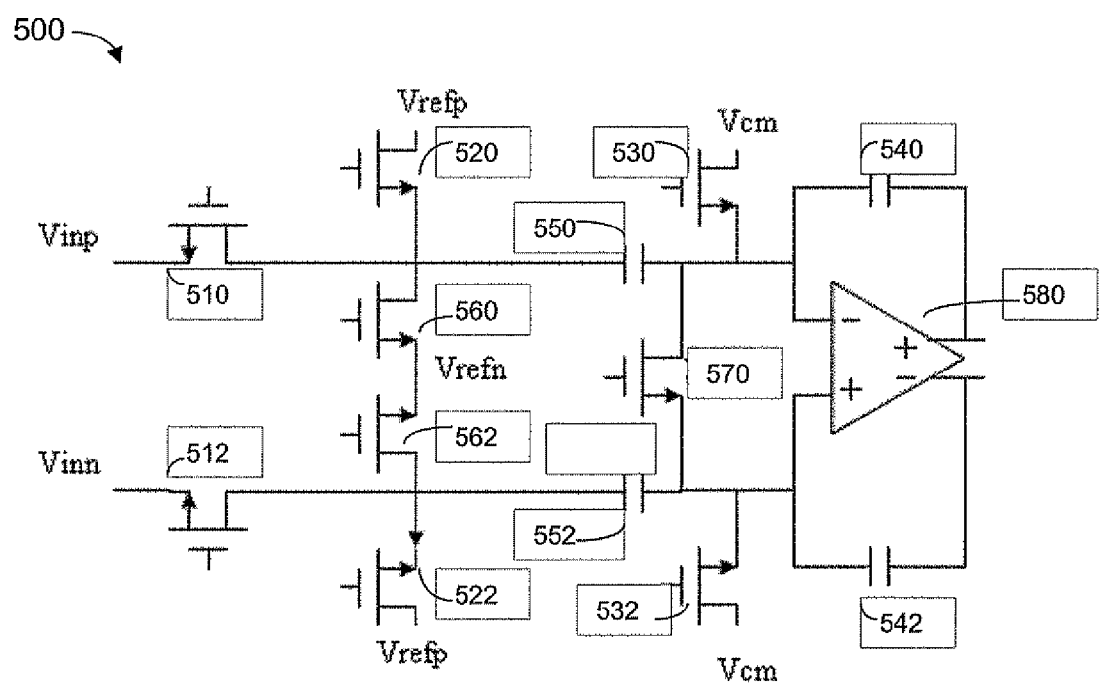
FIG. 5 shows a differential sampling circuit in accordance with an embodiment of the present invention.

Although the foregoing discussion provides examples of single ended implementations, the same concepts apply to differential configurations of each example as well. For example, two sampling circuits 100, of FIG. 2 may be used in parallel, one for the first path of the differential signal and the second for the second path of the differential signal. In this regard, input 180 of the first circuit 100 can be assumed to be the first input terminal of the differential signal and input 180 of the second circuit 100 can be assumed to be the second input terminal of the differential signal. FIG. 5 shows a differential sampling circuit in accordance with an embodiment of the present invention. Vinp represents the positive input of the differential path and Vinn represents the negative input of the differential path. Accordingly, the positive differential path may comprise a first MOS transistor 520, a second MOS transistor 560, third MOS transistor 510, fourth MOS transistor 530, and at least one memory element 550, and a fifth transistor (not shown) providing a path from a seventh voltage to the bulk of fourth MOS transistor 530 when fifth MOS transistor is "ON." The negative differential path may comprise of comparable components (i.e., 512, 522, 532, and an additional transistor providing a path from the seventh voltage to the bulk of MOS transistor 532). In one embodiment, a single switch 570 may be connected between the second end of at least one memory element 550 and the second end of at least one memory element 552.

Those skilled in the art will readily understand that the concepts described above can be applied with different devices and configurations. Although the present invention has been described with reference to particular examples and embodiments, it is understood that the present invention is not limited to those examples and embodiments. For example, with regard to FIG. 1, even though only a first layer 40 and a second layer 50 are illustrated, the same concepts apply when more layers are used. For example a plurality of junctions could be included in series, further reducing the effective parasitic capacitance. Regarding FIGS. 2 and 4, even though NMOS transistors are illustrated, any of the transistors may be replaced with PMOS transistors. Those skilled in the art will understand that the reference voltages to the first and second layers of the PMOS transistors may be different to assure proper reverse bias of the junctions. For example, for PMOS, the bulk may be connected to Vdd instead of ground. The present invention as claimed, therefore, includes variations from the specific examples and embodiments described herein, as will be apparent to one of skill in the art. Accordingly, it is intended that the invention be limited only in terms of the appended claims.

What is claimed is:
1. A sampling circuit comprising:
a memory element having an input terminal and an output terminal,
a storage node configured to pass an input voltage to the input terminal for storage at the memory element,
a first MOS transistor configured to provide a path from a first voltage to the storage node when the first MOS transistor is "ON,"
a third MOS transistor configured to provide a path from a third voltage to a bulk of the first MOS transistor when the third MOS transistor is "ON" and to float the bulk of the first MOS transistor when the third MOS transistor is "OFF," wherein an effective parasitic capacitance of the first MOS transistor is reduced when the third MOS transistor is "OFF,"
a sixth MOS transistor coupled to the output terminal, and configured to provide a path from a sixth voltage to the output terminal when the sixth MOS transistor is "ON," and
a seventh MOS transistor configured to provide a path from a seventh voltage to a bulk of the sixth MOS transistor when the seventh MOS transistor is "ON," and to float the bulk of the sixth MOS transistor when the seventh MOS transistor is "OFF," wherein an effective parasitic capacitance of the sixth MOS transistor is reduced when the seventh MOS transistor is "OFF;"
wherein:
during a sample phase of operation, the bulk of the first MOS transistor is floated while the bulk of the sixth MOS transistor is un-floated, and during a hold phase of operation, the bulk of the first MOS transistor is un-floated while the bulk of the sixth MOS transistor is floated.

2. The sampling circuit of claim 1, further comprising:
a second MOS transistor configured to provide a path from a second voltage to the storage node when the second MOS transistor is "ON," and
a fourth MOS transistor configured to provide a path from a fourth voltage to a bulk of the second MOS transistor when the fourth MOS transistor is "ON," and to float the bulk of the second MOS transistor when the fourth MOS transistor is "OFF," wherein an effective parasitic capacitance of the second MOS transistor is reduced by turning the fourth MOS transistor "OFF" during the sample phase.

3. The sampling circuit of claim 2, wherein the memory element is at least one capacitor, wherein a first end of the at least one capacitor is coupled to the storage node.

4. The sampling circuit of claim 2, further comprising a fifth MOS transistor configured to provide a path from a fifth voltage to the storage node when the fifth MOS transistor is "ON."

5. The sampling circuit of claim 2, wherein:
the effective parasitic capacitance of the first MOS transistor is equal to its Cj when its bulk has a path to the third voltage, and has an effective parasitic capacitance of a series combination of its Cj plus its Cw when its bulk is floating, and
the effective parasitic capacitance of the second MOS transistor is equal to its Cj when its bulk has a path to the fourth voltage and has an effective parasitic capacitance of a series combination of its Cj plus its Cw when its bulk is floating.

6. The sampling circuit of claim 2, wherein the bulk of the first MOS transistor and the bulk of the second MOS transistor are periodically refreshed.

7. A method of providing a sampling circuit comprising:
providing a storage node configured to store a voltage across an input terminal and an output terminal of a memory element,
providing a path from a first voltage to the storage node when a first MOS transistor is "ON,"
providing a path from a third voltage to a bulk of the first MOS transistor when a third MOS transistor is "ON,"
floating the bulk of the first MOS transistor when the third MOS transistor is "OFF," wherein an effective parasitic capacitance of the first MOS transistor is reduced when the third MOS transistor is "OFF,"
providing a path from a sixth voltage to the output terminal when a sixth MOS transistor is "ON,"
providing a path from a seventh voltage to a bulk of the sixth MOS transistor when a seventh MOS transistor is "ON," and
floating the bulk of the sixth MOS transistor when the seventh MOS transistor is "OFF," wherein an effective parasitic capacitance of the sixth MOS transistor is reduced when the seventh MOS transistor is "OFF,"
wherein:
during a sample phase of operation, the bulk of the first MOS transistor is floated while the bulk of the sixth MOS transistor is un-floated, and
during a hold phase of operation, the bulk of the first MOS transistor is un-floated while the bulk of the sixth MOS transistor is floated.

8. The method of claim 7, further comprising:
providing a path from a second voltage to the storage node when a second MOS transistor is "ON,"
providing a path from a fourth voltage to a bulk of the second MOS transistor when a fourth MOS transistor is "ON," and
floating the bulk of the second MOS transistor when the fourth MOS transistor is "OFF," wherein an effective parasitic capacitance of the second MOS transistor is reduced by turning the fourth MOS transistor "OFF" during a sample phase.

9. The method of claim 8, wherein the memory element is at least one capacitor, wherein a first end of the at least one capacitor is coupled to the storage node.

10. The method of claim 8, further comprising providing a path from a fifth voltage to the storage node when a fifth MOS transistor is "ON."

11. The method of claim 8, wherein:
the effective parasitic capacitance of the first MOS transistor is equal to its Cj when its bulk has a path to the third voltage, and has an effective parasitic capacitance of a series combination of its Cj plus its Cw when its bulk is floating, and
the effective parasitic capacitance of the second MOS transistor is equal to its Cj when its bulk has a path to the fourth voltage and has an effective parasitic capacitance of a series combination of its Cj plus its Cw when its bulk is floating.

12. The method of claim 8, wherein the bulk of the first MOS transistor and the bulk of the second MOS transistor are periodically refreshed.

13. A sampling circuit comprising:
a memory element having an input terminal and an output terminal,
a storage node configured to pass an input voltage to the input terminal for storage at the memory element,
a first MOS transistor configured to provide a path from a first voltage to the storage node when the first MOS transistor is "ON,"
a second MOS transistor configured to provide a path from a second voltage to the storage node when the second MOS transistor is "ON,"
a third MOS transistor configured to provide a path from a fifth voltage to the storage node when the third MOS transistor is "ON,"
a fourth MOS transistor coupled to the output terminal of the memory element, configured to provide a path from a sixth voltage to the output terminal of the memory element when the fourth MOS transistor is "ON,"
a fifth MOS transistor configured to provide a path from a seventh voltage to a bulk of the fourth MOS transistor when the fifth MOS transistor is "ON," and to float the bulk of the fourth MOS transistor when the fifth MOS transistor is "OFF,"
wherein:
an effective parasitic capacitance of the fourth MOS transistor is reduced when the fifth MOS transistor is "OFF,"
the bulk of the fourth MOS transistor is periodically refreshed,
during a sample phase of operation, bulks of the first MOS transistor and the second MOS transistor are floated while the bulk of the fourth MOS transistor is un-floated, and
during a hold phase of operation, the bulks of the first MOS transistor and the second MOS transistor are un-floated while the bulk of the fourth MOS transistor is floated.

14. A differential sampling circuit comprising two parallel paths, each parallel path comprising:

a memory element having an input terminal and an output terminal, a storage node configured to pass an input voltage to the input terminal for storage at the memory element, a first MOS transistor configured to provide a path from a first voltage to the storage node when the first MOS transistor is "ON,"

a second MOS transistor configured to provide a path from a second voltage to the storage node when the second MOS transistor is "ON,"

a third MOS transistor configured to provide a path from a fifth voltage to the storage node when the third MOS transistor is "ON,"

a fourth MOS transistor coupled to the output terminal of the memory element, configured to provide a path from a sixth voltage to the output terminal of the memory element when the fourth MOS transistor is "ON,"

a fifth MOS transistor configured to provide a path from a seventh voltage to a bulk of the fourth MOS transistor when the fifth MOS transistor is "ON," and to float the bulk of the fourth MOS transistor when the fifth MOS transistor is "OFF,"

wherein:

an effective parasitic capacitance of the fourth MOS transistor is reduced when the fifth MOS transistor is "OFF,"

the bulk of the fourth MOS transistor is periodically refreshed, during a sample phase of operation, bulks of the first MOS transistor and the second MOS transistor are floated while the bulk of the fourth MOS transistor is un-floated, and during a hold phase of operation, the bulks of the first MOS transistor and the second MOS transistor are un-floated while the bulk of the fourth MOS transistor is floated.

* * * * *